United States Patent [19]
Anderson et al.

[11] Patent Number: 5,401,911
[45] Date of Patent: Mar. 28, 1995

[54] VIA AND PAD STRUCTURE FOR THERMOPLASTIC SUBSTRATES AND METHOD AND APPARATUS FOR FORMING THE SAME

[75] Inventors: Herbert Anderson, Patterson; Arthur Bross, Poughkeepsie; Julian G. Cempa, Deposit; Robert O. Lussow, Hopewell Junction; Donald E. Myers; Thomas J. Walsh, both of Poughkeepsie, all of N.Y.

[73] Assignee: International Business Machines Corporation, Armonk, N.Y.

[21] Appl. No.: 863,645

[22] Filed: Apr. 3, 1992

[51] Int. Cl.⁶ .............................................. H05K 3/36
[52] U.S. Cl. ..................... 174/262; 174/266; 29/845; 29/830; 100/295; 264/241
[58] Field of Search ............. 29/432.1, 625, 843, 29/845, 877, 837, 898, 69, 830; 437/189, 195, 209; 439/66; 350/336; 361/323, 393, 396, 413; 174/257, 259, 265, 264–267, 262; 100/295; 264/241, 511, 27, 25, 319

[56] References Cited

U.S. PATENT DOCUMENTS

| | | | |
|---|---|---|---|
| 3,148,310 | 9/1964 | Feldman | 174/265 |
| 3,541,222 | 11/1970 | Parks | 174/88 R |
| 3,835,531 | 9/1974 | Luttmer | 29/625 |
| 3,998,824 | 12/1976 | Otsuki | 264/249 |
| 4,050,756 | 9/1977 | Moore | 29/845 |
| 4,136,275 | 1/1979 | McCullough | 29/432 |
| 4,346,516 | 8/1982 | Yokouchi et al. | 29/845 |
| 4,644,101 | 2/1987 | Jin et al. | 178/18 |
| 4,761,871 | 8/1988 | O'Connor et al. | 29/432.1 |
| 4,902,857 | 2/1990 | Cranston | 174/94 R |
| 4,931,598 | 6/1990 | Calhoun | 174/117 |
| 4,966,857 | 10/1990 | Haghiri-Tehrani et al. | 437/209 |
| 5,121,299 | 6/1992 | Frankeny et al. | 361/413 |
| 5,172,303 | 12/1992 | Bernardoni et al. | 361/396 |

*Primary Examiner*—Bruce A. Reynolds
*Assistant Examiner*—Michael D. Switzer
*Attorney, Agent, or Firm*—Whitham, Curtis, Whitham & McGinn

[57] ABSTRACT

An improved connection through a substrate layer is formed by embedding a conductive element such as a pin on one or more balls or spheres in a thermoplastic material which is preferably a liquid crystal polymer. The substrate may be heated to facilitate the embedding process in which material of the substrate layer is reflowed under pressure to retain the conductive element by means of a preload force. The formation of such connections with either pins or plural conductive elements allows independence of aspect ratio of the connection and, hence, feature size of conductive patterns on the substrate and the thickness of the substrate layer. Perfecting features of the substrate and method and apparatus for forming the substrate, embedding to a selected depth to form protrusions and recesses to assist in registration of a substrate layer with another substrate layer, metallization to form pads, improved connection between metallization patterns on the substrate and the conductive elements, the regulation of pressurization of substrate material by means of differently shaped dimples or a renewable surface and several alternative arrangements for positioning and embedding the conductive elements. Multiple types of conductive elements may be simultaneously embedded to different depths in a single substrate and from either or both sides thereof to form a variety of substrate structures.

95 Claims, 4 Drawing Sheets

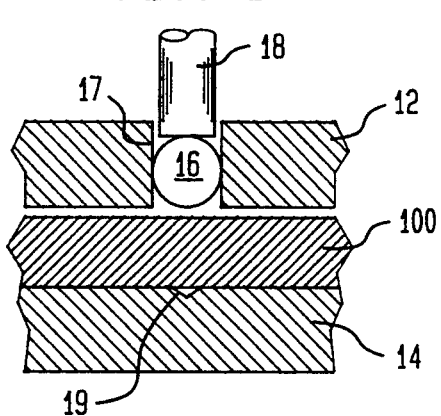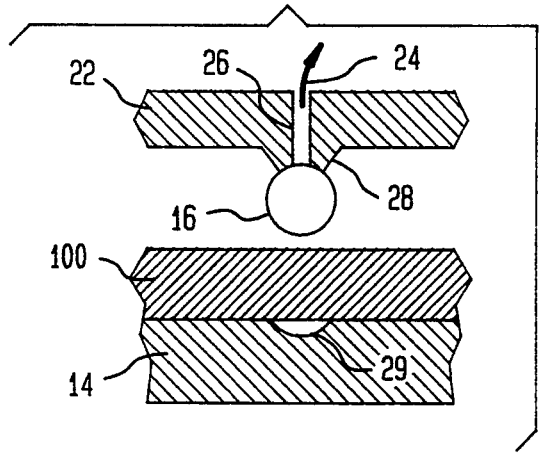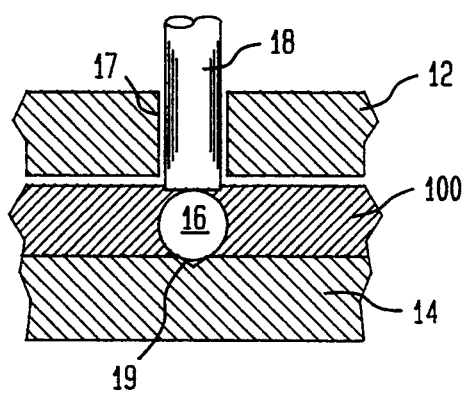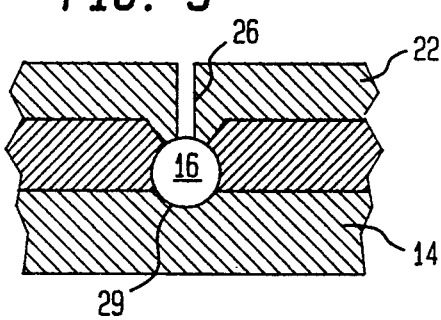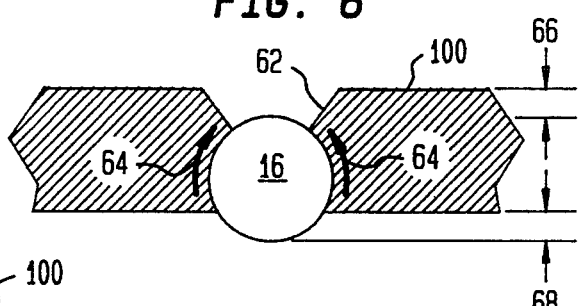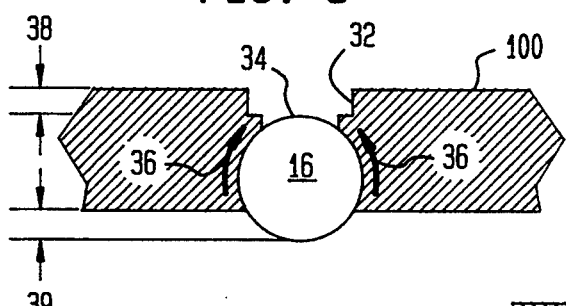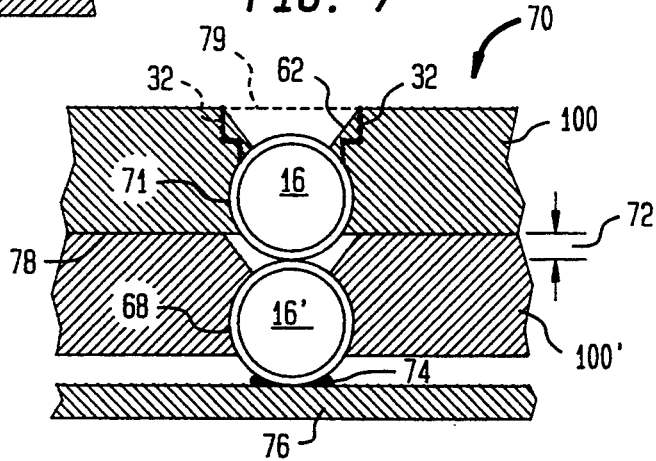

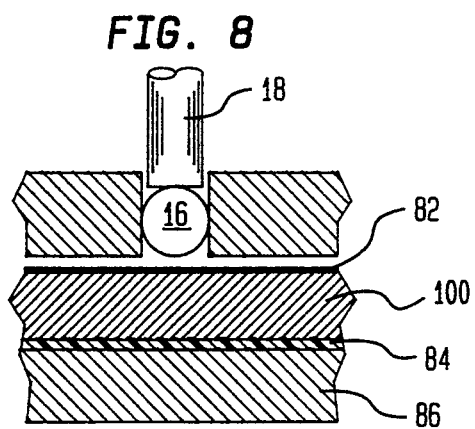
FIG. 8
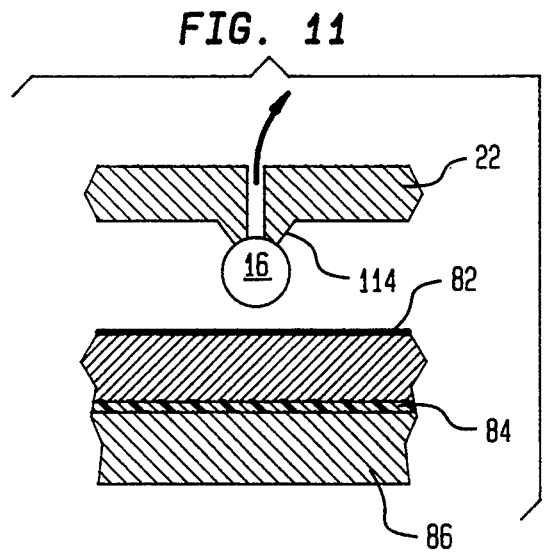
FIG. 11
FIG. 12
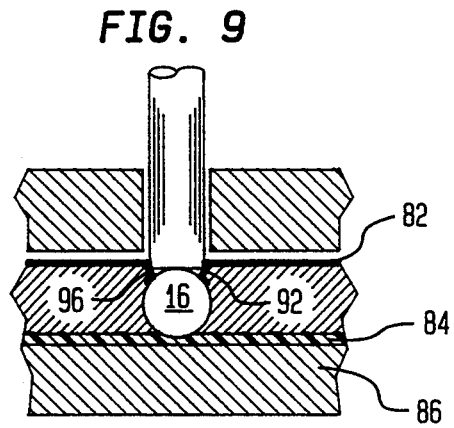
FIG. 9
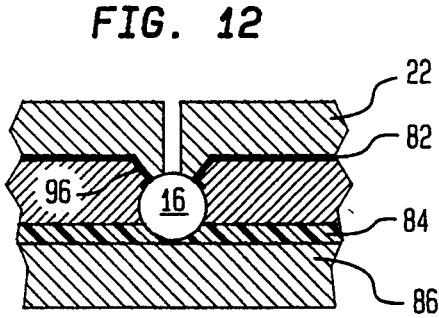
FIG. 13
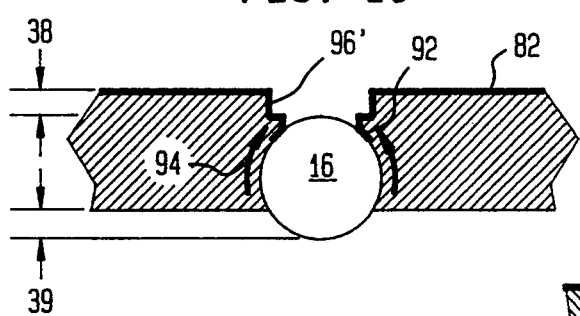
FIG. 10
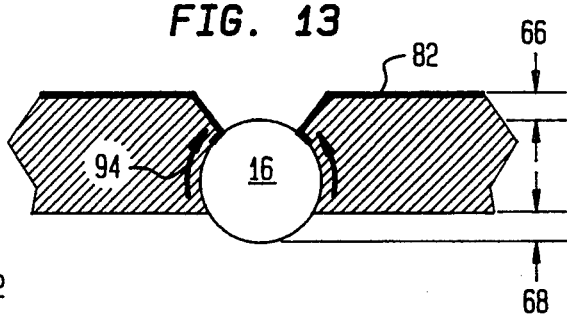
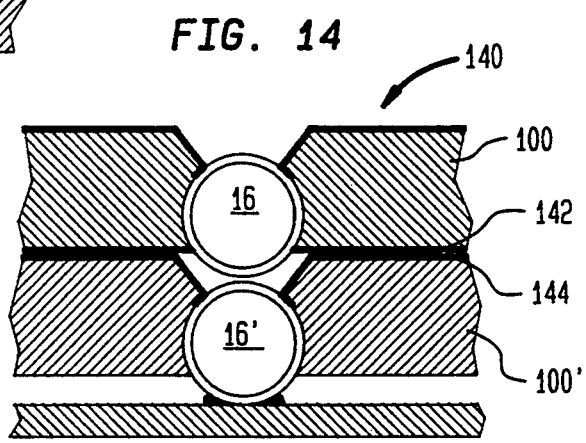
FIG. 14

VIA AND PAD STRUCTURE FOR THERMOPLASTIC SUBSTRATES AND METHOD AND APPARATUS FOR FORMING THE SAME

CROSS-REFERENCE TO RELATED APPLICATIONS

This application is related to concurrently filed U.S. patent applications Ser. No. 07/863,643, filed Apr. 3, 1992 by H. R. Anderson, et al., entitled HIGH DENSITY CONNECTOR SYSTEM AND METHOD OF MANUFACTURE and U.S. Ser. No. 07/863,627, filed Apr. 3, 1992 by H. R. Anderson, et al., entitled MULTI-LAYER THERMOPLASTIC ELECTRONIC PACKAGE AND METHOD OF MAKING SAME, both assigned to the assignee of the present invention.

BACKGROUND OF THE INVENTION

1. Field of the Invention

The present invention generally relates to multi-layer circuit structures and, more particularly, to the formation of connections between layers and at the surfaces of thermoplastic substrate layers and assemblies thereof.

2. Description of the Prior Art

As electronic circuits have become more complex, it has often been the practice in the fabrication of electronic devices and components thereof to assemble components on generally planar structures and to provide connections between components on the surface of or within the generally planar structure. Early examples of such generally planar structures were printed circuit boards having connections on one or both surfaces of a board made of an insulating material. With increased circuit complexity, particularly for digital circuits, multi-layer boards having connection patterns provided between thin insulating lamina and connections between conductive pattern layers formed at through holes became widely used.

As the demand for components including multiple integrated circuits or requiring circuits fabricated according to different semiconductor technologies has grown, other multi-layer structures have been used, such as multi-layer ceramic (MLC) or glass structures. These structures have also allowed an extremely high degree of miniaturization since each layer can be fabricated with extremely high accuracy. However, the formation of connections between layers has presented some difficulty. For example, in MLC devices, connection patterns are usually formed by screening of a conductive paste onto the surface of unfired layers of the ceramic material, generally referred to as green sheets. To make interlayer connections, the formation of holes in the green sheet was required as was the filling of the holes with conductive paste during screening. Such a procedure requires a minimum of two separate steps, each of which must be done with a high degree of accuracy of registration and would inherently result in some defective layers (requiring additional testing steps). More importantly, however, the green sheets with connection patterns thereon must be stacked with a high degree of accuracy and registration, subjected to pressure and sintered at a high temperature. This final high temperature operation effectively removes solvents and organic binders from the conductive paste (by means of which it was made of a screenable consistency) and results in connections which are porous, particularly in interlayer connection holes, known as vias. This porosity causes a reduction in effective cross-sectional area of the connection and increases resistance. Densification of the conductive paste has yielded some improvement in reliability of connections at the cost of additional processing steps. However, a substantial degree of porosity must remain inherent in the formation of conductors with a screenable paste since the constituent materials of the paste which permit it to flow, as in the screening process, must be removed from the final product. Since the porosity and distribution of voids in the via connections is not readily controllable, defects were often encountered in the course of manufacture or, later, in use.

For this reason, numerous techniques of producing via connections and various via connection structures have been proposed. For example, U. S. Pat. No. 4,346,516, to Yokouchi et al. discloses a technique of pressing soft conductive metal (e.g. gold) spheres into the soft, elastic material of the green sheets. However, as disclosed therein, the process was extremely critical as to the diameter of the spheres and subject to relocation or dislodging of the balls during the assembly of layers and sintering of the assembly, largely due to the resiliency of the green sheet and the dimensional changes of the green sheet during sintering. The process was further complicated by the contamination of the surfaces of the green sheets with particles of green sheet material and possibly conductive paste which was displaced as spheres were pressed into the green sheet material. Further, the structure of Yokouchi et al. is explicitly limited to connections made with single spheres, limiting the aspect ratio of the via connections and consequently limiting integration and connection density and imposing severe constraints on design rules as to feature size of screened conductive patterns. The formation of connections from the screened patterns to the spheres was unreliable due to the displacement of the conductive paste (which also was subject to defects due to porosity, as indicated above). Also, with spheres, especially in a single layer, the area of contact with the sphere is very small in relation to the volume of the sphere and cross-sections thereof. Further, the use of spheres, particularly if arranged to protrude slightly from the green sheet surface, often increased the difficulty of obtaining and/or maintaining accurate registration between layers and were particularly subject to being dislodged since retention in the green sheet is accomplished only through elastic deformation of the green sheet material. Registration of layers and the formation of interlayer connections is potentially made more difficult by dimensional changes during sintering of the green sheets, particularly in relation to the dimensions and dimensional changes of the conductive balls. These dimensional changes can also cause the balls to become dislodged or laterally displaced during sintering, as well. Additionally, the structure disclosed by Yokouchi is not applicable to the formation of pads for connection to integrated circuit chips which may be mounted on the MLC structure or engineering change external wiring.

More recently, thermoplastic materials of increased suitability for use as carriers for interconnection patterns have been developed. These materials generally are capable of withstanding higher temperatures with little or no dimensional change or tendency to spontaneously flow. So-called liquid crystal polymers, in particular, are very suitable for forming carriers for interconnection patterns since they are platable with metal to form a metallized layer which can be patterned by many known techniques such as selective deposition or etching. However, the reliable formation of interlayer connections through vias remains difficult at the level of current design rules for minimum feature size in multilayer devices. Accurate formation of holes is difficult (although molding of holes provides some advantages in comparison to drilling as to both accuracy of location and number of process steps) and plating through vias is less than fully reliable particularly at hole aspect ratios (e.g. depth to diameter) of one or more. The use of a conductive paste is not desirable since it would require additional manufacturing steps and would not be of increased reliability in comparison to the use of such a paste in MLC devices. Screening of paste into holes of an aspect ratio of one or more is also not fully reliable. In addition, the use of thermoplastic materials for lamina in multi-layered structures is subject to misregistration as in the case of green sheets. Therefore, while lamina are readily moldable from thermoplastic materials, the need for the formation of via connections has not permitted the full exploitation of potential advantages of such materials in multi-layer electronic devices.

SUMMARY OF THE INVENTION

It is therefore an object of the present invention to provide a structure for forming via connections in lamina of thermoplastic material which can be formed in a minimum number of steps and which will assist in registration of plural lamina and which can be carried out at high positional accuracy.

It is another object of the invention to provide a via connection structure which is compatible with the formation of a metal layer on a thermoplastic lamina and with increased contact area between the metal layer and the via connection structure.

It is a further object of the invention to provide a via connection structure which is capable of being formed at a high aspect ratio of via depth to via diameter.

It is another further object of the invention to provide a common technique which is equally applicable to the formation of via connections and pads for connection to other lamina, integrated circuit chips and external wiring.

It is yet a further object of the invention to provide a method of a minimal number of steps of forming the via connection structure in accordance with the invention and which can be carried out at high accuracy.

It is yet another further object of the invention to provide high throughput apparatus for forming via connections in accordance with the invention with high accuracy and repeatability.

In order to achieve the above and other objects of the present invention, a substrate layer is provided consisting essentially of a relatively non-conductive polymer material having a relatively conductive region therein and formed by a process comprising the steps of embedding at least one conductive element in the relatively non-conductive polymer material and causing reflow of at least a portion of the relatively non-conductive polymer material around the conductive element.

In accordance with another aspect of the invention, a relatively non-conducting polymer substrate is provided having at least one conducting element embedded therein and retained by reflowed relatively non-conducting polymer material of said substrate.

In accordance with a further aspect of the invention, an apparatus is provided for forming a relatively non-conductive polymer substrate having conductive regions therein including a support for volume of relatively non-conducting polymer material in the form of a layer, and means for positioning at least one conductive element adjacent a surface of a volume of relatively non-conductive polymer material, and introducing said at least one conductive element into said relatively non-conductive polymer material while causing reflowing of a portion of said relatively non-conductive polymer material of said layer.

In accordance with another further object of the invention, a method of forming a relatively non-conductive polymer substrate of a relatively non-conductive polymer material, said substrate having conductive regions therein is provided including the steps of supporting a volume of relatively non-conducting polymer material in the form of a layer, positioning at least one conductive element adjacent a surface of a volume of relatively non-conductive polymer material, and introducing said at least one conductive element into the relatively non-conductive polymer material while causing reflowing of a portion of the relatively non-conductive polymer material of the layer.

In accordance with yet a further aspect of the invention, a method is provided comprising the steps of embedding a conductive element into a relatively non-conductive polymer material at a site thereon having a predetermined area extending around said conductive element, and eliminating a dimensional change of the predetermined area of the site during and subsequent to the embedding step.

BRIEF DESCRIPTION OF THE DRAWINGS

The foregoing and other objects, aspects and advantages will be better understood from the following detailed description of a preferred embodiment of the invention with reference to the drawings, in which:

FIGS. 1 and 2 are illustrations of the fabrication of a via connection in accordance with one embodiment of the invention together with corresponding apparatus, FIG. 3 is an enlarged view of a via connection structure formed in accordance with the method and apparatus of FIGS. 1 and 2, FIGS. 4 and 5 are illustrations of the fabrication of a via connection in accordance with another embodiment of the invention together with corresponding apparatus, FIG. 6 is an enlarged view of a via connection structure formed in accordance with the method and apparatus of FIGS. 4 and 5, FIG. 7 shows an exemplary multi-layer structure formed from lamina illustrated in FIGS. 1-6, FIGS. 8 and 9 are illustrations of the fabrication of a via connection in accordance with an embodiment of the invention similar to FIGS. 1 and 2 but in which the thermoplastic lamina includes a metal layer on a surface thereof, together with corresponding apparatus as well as the use of a renewable surface in accordance with a further feature of the invention which is similarly applicable to the formation of via connections as shown in any of FIGS. 1-22, FIG. 10 is an enlarged view of a via connection structure formed in accordance with the method and apparatus of FIGS. 8 and 9, FIGS. 11 and 12 are illustrations of the fabrication of a via connection in accordance with another embodiment of the invention similar to FIGS. 4 and 5 but in which the thermoplastic lamina include a metal layer on a surface thereof, together with corresponding apparatus, FIG. 13 is an enlarged view of a via connection structure formed in accordance with the method and apparatus of FIGS. 11 and 12, FIG. 14 shows an exemplary multi-layer structure formed from lamina illustrated in FIGS. 8–13, FIGS. 15, 16, 17 and 18 show a variation of the formation of the via connection according to the invention applicable to the methods and structures of any of FIGS. 1–14, FIGS. 19, 20, 21 and 22 show another variation of the formation of the via connection according to the invention applicable to the methods and structures of any of FIGS. 1–14, FIGS. 23 and 24 show variations of formation of a via connection of high aspect ratio.

DETAILED DESCRIPTION OF A PREFERRED EMBODIMENT OF THE INVENTION

Figure 15:
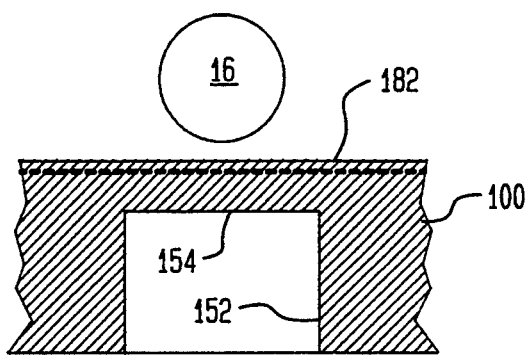
Figure 19:
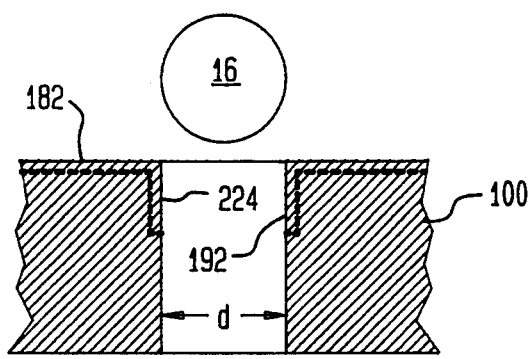
Figure 16:
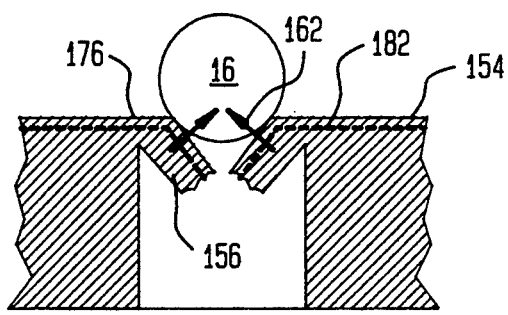

Referring now to the drawings, and more particularly to FIG. 1, there is shown a cross-section of a thermoplastic lamina and apparatus for forming a via connection in accordance with one embodiment of the invention. FIG. 1 in particular shows the arrangement of thermoplastic substrate 100, retainer plate 12, backer plate or die 14, conductive ball 16 and driver 18 immediately prior to the formation of a via connection in accordance with the invention. High temperature melting point polymer materials such as polyketone, polyimide, polyphenylene sulfide, polyarylsulfone, polyethersulfone, polyetherimide, polyetherketone and polyetheretherketone are particularly suitable thermoplastic polymer materials for substrate 100. Polycarbonate and polyphenyleneoxide are considered usable but marginal when other high temperature processes such as soldering are required. Liquid crystal polymers such as Xydar TM, available from Amoco Corp. and Vectra TM, available from Hoecsht-Celanese Corp. are especially preferred for the practice of the invention.

It is to be understood that, while some embodiments of the invention will be discussed in terms of balls or spheres, other more or less regular shapes may also be used, such as pins or even relatively irregular shapes, particularly in embodiments where a plurality of conductive elements are embedded at a single location as illustrated in FIGS. 23–27, both of which will be discussed below. Apertures 17 in retainer plate 12 will preferably provide a very slight frictional engagement with conductive balls 16. However, it is to be understood that retention of balls within the retainer plate 12 could be accomplished by a plurality of means such as coating of the balls with a fluid having a high surface tension, a frangible coating on the balls to cause slight dimensional interference, or magnetic or pneumatic means. Alternatively, the retainer plate 12 could be assembled with the thermoplastic substrate 100 before balls are loaded into the retainer plate 12, whereby the provision for retention of the conductive balls 16 by retainer plate 12 is merely the holes of the retainer plate.

Using any of these or other retention techniques, the conductive balls could be loaded into the retainer plate 12 by merely releasing the balls 16 against the top surface of retainer plate 12 and agitating them by movement of the retainer plate 12, such as by vibration, or by directly agitating the conductive balls 16, such as with a wiper or squeegee or by gas or fluid pressure. A separate retainer plate or a plurality thereof is prepared for each pattern and/or partial pattern of via or pad connections to be made. Accordingly, it will be appreciated that the positioning of the balls can be done to substantially the same accuracy as the accuracy of the retainer plate 12 and that this accuracy of positioning is highly repeatable.

A driver 18 is provided in positional correspondence with each hole 17 in the retainer plate 12 or at least at those holes where a conductive element such as ball 16 is to be embedded. It is deemed preferable to provide a driver plate including a driver 18 corresponding to holes 17 in retainer plate 12. The positional accuracy of drivers 18 need not be as great as that of retainer plate 12 but reasonably high accuracy of positional correspondence is desirable.

Backer plate 14, in accordance with one variation of the invention includes a conical dimple 19 corresponding to each hole in the retainer plate 12 in order to regulate reflow of thermoplastic substrate material as the via connection is formed. The conical dimple shown in FIGS. 1 and 2 allows a slight protrusion of the ball from the bottom of the substrate when the via is formed which will be discussed in further detail in regard to FIGS. 3 and 7, below. A conical dimple also provides for a tangential cutoff of the thermoplastic material along a circular locus where the ball and conical dimple come into contact during formation of the via connection. Additionally, the amount of substrate material which will be allowed to be removed from the substrate during the formation of via connections can be closely regulated by the depth and angle of the sides of the conical dimple. Additional volume of the dimple could be provided by extending the dimple by means of one or more holes at the bottom.

As shown in FIG. 2, the via connection is formed by driving the conductive ball into the thermoplastic substrate material with driver 18. The substrate material is preferably heated to a temperature slightly below that at which it will spontaneously flow. The additional pressure and friction caused by the driving of conductive ball 16 into the substrate can thus cause reflow of the thermoplastic material in the immediate vicinity of the ball with nearly instantaneous solidification when the motion of the conductive ball is stopped by die 14.

This process may be considered as if a site for embedding of a conductive element and extending in the vicinity of the conductive element were effectively rigid. The additional energy derived from the pressure and friction of the embedding process thus causes reflow of the thermoplastic material only in the immediate vicinity of the conductive element and not elsewhere in the layer, thus providing not only a preloading of the reflowed thermoplastic material against the conductive element but also eliminating dimensional change of the embedding site and, in the aggregate, the layer itself. This increased dimensional accuracy of the layer formation is especially exploited in accordance with the invention by the fact that the layer is essentially complete and requires no other processing steps (in contrast to the sintering of MLC structures) which could cause dimensional change of the layers or conductive elements.

As shown in FIG. 2 and in enlarged form in FIG. 3, the reflow of the thermoplastic substrate material causes some refilling of the space behind the driven ball 16 as indicated by arrows 36. The reflowed material will assume the shape defined by the die 14, the conductive ball 16 and, to some extent (depending on the pressure achieved), the driver 18. Thus, if the top of the ball is driven slightly below the upper surface of the thermoplastic substrate 100 to form clearance 38 and a substantially equal protrusion 39 of the ball from the lower surface of the substrate (the substrate thickness and the ball diameter being substantially equal), a recess having a shape generally corresponding to the driver 18 will result, as indicated by profile 32. In this regard, it should be noted that it is not desirable for the backflow of thermoplastic material to conform too closely to the ball (or the upper surface of the geometrical shape of the embedded element, such as a pin, discussed below) since such conforming flow tends to reduce the diameter of the opening to the sphere through which electrical connections are made. Such excessive backflow can be restrained by the use of a driver 18 which conforms more closely to the surface of the ball or other element to be embedded.

As indicated above, while the thermoplastic material will flow in the vicinity of the conductive ball 16 due to the increase of pressure and friction as the ball is driven, the ball is retained in the substrate by the relative modula of elasticity of the thermoplastic substrate 100 and the conductive ball 16, which is preferably made of a metal such as copper, silver, gold or the like and with or without a plating to enhance conductivity or contact or bonding with another such element in the same or a different substrate layer. The reflowed material will be under substantially raised pressure when flow ceases and will retain some degree of preloading against the conductive ball.

It is to be understood that the temperature to which the substrate is heated prior to embedding the conductive balls therein is not critical to the practice of the invention and it has been found unnecessary to distinguish between pressurized flow of the thermoplastic material at any particular temperature (e.g. so-called cold flow), where the material would behave, to some degree, as a viscous liquid, and inelastic deformation of the solid material due to the same pressures. Therefore, the term "flow" or "reflow" will be used herein as generic to both of these mechanisms.

However, this process of reflow of material is preferably conducted in a solid thermoplastic polymer substrate requiring no further curing or stabilizing steps subsequent to embedding of the conductive elements, facilitated by some degree of heating. Unless the temperature at which spontaneous flow of the thermoplastic material will occur is exceeded, little or no strain relief will occur and a preload against the conductive ball 16 will be maintained.

Referring now to FIGS. 4–6, a variation of the invention will be discussed. It has been found, in practice, that an increase of pressure on the thermoplastic material provides somewhat superior results and, therefore, the provision for loss of material should often be minimized. Accordingly, the embodiment of FIG. 4 provides a dimple 29 closely corresponding to the shape of the conductive ball 16, providing for the retention of all of the thermoplastic material of the substrate. Dimple 29 thus tends to maximize material reflow, particularly immediately before ball 16 reaches die 14.

The variant form of the invention shown in FIGS. 4–6 also differs from that of FIGS. 1–3 by the provision of a presser plate 22 against which conductive balls 16 are preferably retained by suction, applied through aperture 26, as indicated by arrow 24. This provision of pneumatic retention of the conductive balls 16 also assists in the loading of the presser plate 22 and generally is somewhat more reliable in the fabrication of the invention since the pneumatic flow through aperture 26 will directly attract conductive balls 16 until a ball is seated against the opening. Pneumatic flow could also be measured and the result used to effectively sense that a conductive ball was, in fact, seated at each and every desired location. This structure also effectively combines the functions of retainer plate 12 and driver 18 of FIG. 1 since the presser plate 22 is directly used to drive the balls into the thermoplastic substrate.

As an enhancement of presser plate 22, a generally frustro-conical raised or salient portion 28 is provided at each desired conductive ball location. The raised feature provides for the ball to be driven slightly beyond the front surface of the thermoplastic substrate, as in the embodiment illustrated in FIGS. 1–3 to provide protrusion 68 and recess clearance 66 as shown in FIG. 6. Additionally, the conical outer surface 28 of this feature provides an inclined profile 62 which is preferred for reasons which will be discussed below with reference to FIG. 7. Further, at the end of the pressing operation, the conical surface also serves to displace thermoplastic substrate material which has reflowed as indicated by arrows 64 and to maximize pressure on the thermoplastic material when reflow of material is terminated.

Finally, in regard to the variation of the invention as illustrated in FIGS. 4–6, while the spherical dimple avoids loss of substrate material and thus maximizes pressure exerted on the reflowed thermoplastic material, no cutoff point is provided as was done by the conical dimple of FIGS. 1 and 2. Therefore, if a die 14 having dimples of a spherical profile, is used, the surface of balls 16 at protrusion 68 should be cleaned of thermoplastic material to insure good electrical contact therewith. Cleaning is also preferred with the use of conical dimples but is not as critical since a cutoff is provided allowing any residue to flake off of the conductive balls 16.

FIG. 7 illustrates an example of the construction of a layered structure 70 formed from lamina fabricated in accordance with either FIGS. 1–3 or 4–6, the difference being only in the difference in the recess profiles 62 or 32, the latter being depicted by dashed lines. Since the diameter of the conductive balls 16, 16' and substrate thicknesses are chosen to be approximately equal, the protrusion dimensions 39 or 68 will be approximately equal to clearance dimensions 38 and 66 shown in FIGS. 3 and 6, respectively. Thus, these protrusions and recesses will provide essentially self-locating structures, indicated by dimension 72, when several lamina are layered together. Profile shape 62 is deemed slightly preferable to perform this function to provide exact registration of substrate 100 over substrate 100'.

It should be noted from FIG. 7 that the protrusion 68 of conductive ball 16' provides a good pad profile for the connection of a chip 76 by reflow of a solder preform or other connection structure indicated generally at 74 of FIG. 7. Also, on an opposite surface of the layered structure 70, metallization or other conductive material can be provided in the recess having either profile 32 or 62 to provide a pad such as a so-called engineering change (EC) pad generally indicated at 79. Similarly, these recesses can accommodate solder preforms for the attachment of connection pins (not shown). Regardless of the structure attached at the recess, the recess will provide a self-locating or self-aligning function in the same manner that such a function is produced between layers of the multi-layer structure 70.

Additionally, in FIG. 7, it should be noted that metallization or other conductive structures 78 could be formed on either surface of either substrate in contact with either of conductive balls 16 or 16'. However, this is not generally preferred since the invention provides for a more reliable connection structure to such connection layers as will be discussed with reference to FIGS. 8-14.

The plating of elements to be embedded in a substrate to enhance conductivity or connectivity, referred to above, is also illustrated at 71 in FIG. 7. It is to be understood that this variation of the invention is applicable to all other Figures but is omitted therein in the interest of clarity. More specifically, plating materials such as gold, silver and copper which are highly conductive and relatively soft can be used to enhance conductivity of the conductive elements. Such platings also have the effect of reducing the criticality of the conductivity of the underlying material which could then be of another, less conductive material either for the purpose of adjusting the modulus of elasticity of the elements to enhance retention in the substrate or which have other properties (e.g. ferromagnetic) which could be exploited to facilitate manipulation of the conductive elements. Within the scope of the present invention, the plating could also comprise a harder metal, such as nickel, either alone, in combination with or overlaid by another material to avoid the effects of any damage which might be done to the plating during the embedding process, particularly when embedding is done through a metallization layer. Further, the elements to be embedded may be coated with a reflowable material such as a solder to enhance conductivity between embedded elements in the same or different substrate layers either by mutual deformation or reflow, the latter also providing an improved structural connection between embedded elements.

FIGS. 8-14 correspond to FIGS. 1-7 respectively except that a connection layer is provided, preferably as a metallization layer 82 on the front surface of the thermoplastic substrate through which the conductive ball 16 will be pressed. The provision of a metallization layer 82 is facilitated by the fact that the thermoplastic material is platable with metal. Additionally, a renewable surface 84 is provided on the front face of backing plate 86, corresponding to die 14 instead of dimples 19 or 29. It is to be understood that this renewable surface 84 can be employed with the embodiments shown in FIGS. 1-7, as well.

First considering the metallization layer 82 which is preferably formed as a continuous layer at least at the location at which a conductive ball 16 is to be embedded in substrate 100, it is to be noted that a layer formed by plating will generally be relatively ductile since preferred materials are copper, silver, gold and other highly conductive materials and the layer will not previously have been subjected to deformation which would cause strain hardening. As conductive ball 16 is pressed into the surface by driver 18 of FIG. 8 or presser plate 22 of FIG. 11, the metal layer is inelastically deformed and stretched somewhat by tension over the surface of the conductive ball 16. At some point in the embedding process, a yield point of the metal layer will be reached and an aperture will be formed in the material, leaving an elongated margin 92 of the metal layer surrounding the aperture in contact with the conductive ball 16. As the embedding process continues toward the final state shown in FIGS. 9 or 10, the thermoplastic material of the substrate flows as discussed above and illustrated by arrows 94 in FIG. 10. The pressure of this reflow is sufficient to deform the relatively ductile portion 96 of the metal layer, tending to increase the area 92 of the metal layer 82 which is in contact with the conductive ball 16. The final shape of the metal layer 82 will approximate that shown in FIG. 9 or, if substrate material is adequately maintained and the pressure during substrate material flow made adequately high, the final shape will more closely approximate that shown at 96' of FIG. 10, further increasing area 92 in contact with conductive ball 16.

It is to be noted that in this process the metal layer wipes virtually the entire surface of the metal ball under substantial pressure, tending to dislodge any contamination and thus increases the reliability with which the connection is made. Further, as discussed above, when flow of the thermoplastic material ceases, a substantial preload force remains to both retain the ball within the substrate and to maintain the mechanical and electrical contact between area 92 of metal layer 82 and conductive ball 16.

In regard to plating 71, discussed above, it is possible that the wiping action against the metallization layer 82 may cause damage to the coating of the elements and the relative hardness of the material of the plating and the metallization layer should take this into account. For instance, a gold, silver or copper metallization layer would be suitable for use with a copper or nickel plating of the elements to be embedded whereas damage to a gold or solder plating would be expected if the metallization layer 82 were of copper. However, the pressure of the wiping action and, hence, the possibility of damage to platings may be regulated and damage limited or avoided by the use of through-holes or partial depth holes formed (e.g. molded, predrilled, etc.) in the substrate as will be discussed below with reference to FIGS. 15-22. Further, any damage to plating layer 71 of the embedded elements at the exposed front or rear surfaces thereof may be repaired after embedding is accomplished by virtually any material deposition process such as plating or vapor deposition.

Thus, in summary, the metal layer 82 performs much in the manner of a deformable "skin" over a highly viscous fluid during the embedding process, being first deformed and then pierced by the conductive ball 16 and then further deformed and held against the surface of conductive ball 16 by the pressure of the thermoplastic substrate material as it reflows and solidifies while maintaining a preload force urging the margin 92 of the metal layer 82 against the conductive ball 16. The same action is produced during embedding of the conductive ball using presser plate 22 as illustrated in FIGS. 11-13 with the exception that portion 96 of metal layer 82 is positively shaped by pressure against the raised (e.g.

inclined) region 114 of the presser plate 22 as the substrate material reflows as indicated by arrows 94 of FIG. 13.

It should be noted that the thickness of the metal layer 82 should be considered as part of the substrate thickness for purposes of matching that dimension to the diameter of conductive ball 16 to establish clearance 38, 66 with protrusion 39, 68 as approximately equal. As in FIG. 7, FIG. 14 shows that the self-locating feature of substrate layers containing via connections in accordance with the invention is maintained. Metallization 144 on the top surface of substrate 100' is held in contact with conductive ball 16' in the manner described above. It should be noted that the removal of contamination from the surface of conductive balls 16, 16' by the wiping action described above is preserved and the connection effectively sealed by the assembly and/or lamination process. The geometry of the substrate profiles which form or facilitate the formation of pads or other connection structures discussed above with reference to FIG. 7 are also preserved in this variation of the invention. Further, if desired, additional metallization patterns can be provided on the back surface of any or all substrates as shown at 142. However, such back surface metallization, if provided, is preferably carried out after formation of the via connections for the reason which will now be discussed with regard to renewable surface 84.

It will be recalled from the discussion of dimples in die 14 with reference to FIGS. 1-6, that cleaning of the protruding portions of conductive balls 16 was either necessary or at least preferred to insure good electrical contact. Use of renewable surface 84 acts as a cleaning means or a gasket to more fully contain the reflowing thermoplastic substrate material or both to avoid an additional manufacturing step for the purpose of cleaning the thermoplastic material from the conducting balls 16.

Specifically, the use of a comparatively soft surface overlying backer plate 86, which is somewhat resilient and preferably somewhat porous and/or abrasive provides increased containment of the thermoplastic substrate material by providing an improved seal between the substrate 100 and the backer plate 86. At the same time, the preferred slight porosity of the renewable surface 84 can absorb small amounts of the thermoplastic material and remove it from the conductive ball 16. The preferred slight resilience of the renewable surface 84 also provides a degree of wiping action against the conductive ball 16, providing a further abrasive cleaning action.

The renewable surface may be kept clean of the thermoplastic material by either replacement or reworking the surface by a mechanical process such as brushing and/or vacuuming or by chemical cleaning. A preferred material for the renewable surface is card stock such as might be used in index cards or so-called punch cards which are a well-known means of data processor programming or data entry, although other materials having one or more of the above-noted properties of relative softness, resilience, porosity and slight abrasiveness may be used. The thickness of the renewable surface should exceed the protrusion dimension 39, 68, preferably by a factor of about two to four in order to allow for adequate deformation of the renewable surface to accommodate the protrusion. As indicated above, it is to be understood that the renewable surface 84 will function in precisely the same manner with any variation of the invention described in this specification.

Particularly in view of the improved material containment provided by renewable surface 84, it may be desirable to regulate pressure during the embedding process by regulating the amount of substrate material at the site where a conductive ball 16 is to be embedded in substrate 100. Two alternative methodologies are illustrated in FIGS. 15-22, which may also be useful in visualizing the reflow of substrate material described above with reference to FIGS. 1-14. It should also be appreciated that either of these methodologies may also be used to regulate the force applied to the surface of the conductive element and the area over which the wiping action takes place during the above-described wiping action during the embedding process. The dimensions of the through holes and partial depth holes, described below, should take this consideration into account. These methodologies may also be adopted for the purpose of improving the positional accuracy of the embedding processes described above.

In FIG. 15, a hole is provided through a portion of the depth of the substrate 100 from the back side thereof in order to reduce the volume of material at the embedding site. The sides 152 of the partial depth hole will ordinarily be slightly less than the diameter of conductive ball 16 but may provide a slightly larger dimension, depending on the volume of material remaining over the front surface of the substrate at 154. The partial depth hole should ordinarily extend at least through half of the thickness of the substrate if the hole is expected to function to increase the accuracy of location of the conductive ball 16. The embedding process which will now be described with reference to FIGS. 16-18 will be the same whether or not a metallization layer is present as indicated by dashed line 182.

As the embedding process begins, the front surface region 154 above the partial depth hole is elastically and then inelastically deformed. The relative thinness of the region 154 increases this deformation at a given embedding force and produces centering force on conductive ball 16 as indicated by arrows 162 in FIG. 16. As the yield point of the material in region 154 is reached, the material is pierced by the ball to yield an annular margin 156 (which may be overlaid by metal layer 182) which wipes against the surface of conductive ball 16 as the embedding process is carried out. As the diameter of conductive ball approaches the front surface 176 of substrate 100, the material in annular region 156 is made to flow downwardly.

Figure 17:
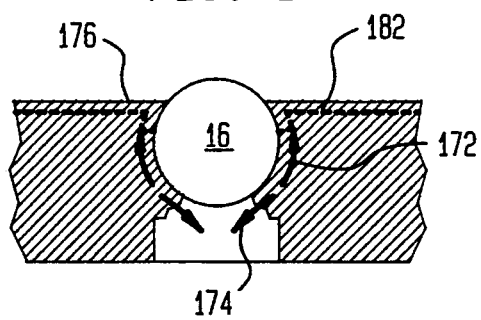

As the diameter of the conductive ball 16 passes the surface 176 of substrate 100, as shown in FIG. 17, the viscous flow of substrate material continues downwardly as shown by arrows 174 and also upward, as shown by arrows 172, since material originally located away from the edge of the opening of annular region 156 will have been deformed more and thus be slightly less viscous than material originally at the edge of the opening. Further upward flow increases as the conductive ball 16 is driven to its final position as shown by FIG. 18.

A further variation of the invention is illustrated in FIGS. 19-22 in which a through-hole is provided in the thermoplastic substrate 100 in order to regulate pressure and flow of thermoplastic material of the substrate and provide increased positional accuracy of the final placement of conductive ball 16. This variation of the invention may be used with any other variation of the invention disclosed in this specification, including the variation illustrated in FIGS. 15–18. It is to be understood that a metallization layer (not illustrated in FIGS. 19–21) can also be used with this variation of the invention in much the same manner as discussed in regard to this variation of the invention and with only slight modification of design constraints.

Figure 18:
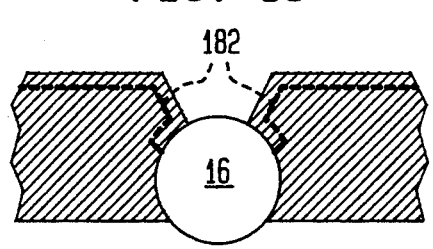

As shown in FIG. 18, a through-hole 192 is provided in substrate 100. The diameter of the through-hole must be smaller than the diameter of conductive ball 16 and, at the front surface should be of sufficiently small diameter that a sufficient length of metal layer is provided in order to reach the final intended location of conductive ball 16. Otherwise, no restrictions are placed on the shape of the bore of the through-hole which could be tapered or stepped to further refine regulation of flow of substrate material during the embedding process. Alternatively, metallization can be provided after the embedding process to assure connection between edge of metallization layer 182 and conductive ball 16, as shown at 222 of FIG. 22. As a further alternative, some metallization could be provided within the through-hole 192 as shown at 224 of FIG. 19 which would perform in much the same manner as the metallization layer in FIGS. 15–18 during the embedding process.

Figure 20:
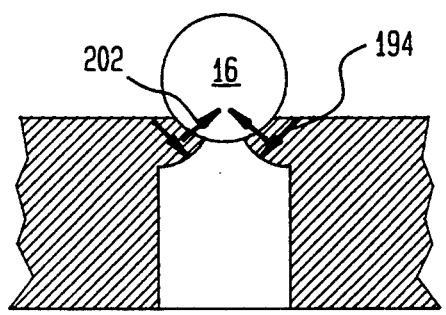
Figure 21:
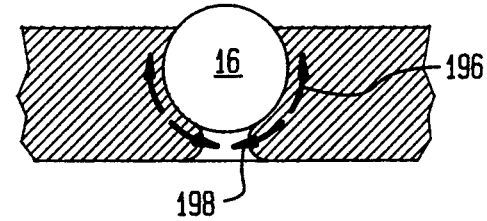
Figure 22:
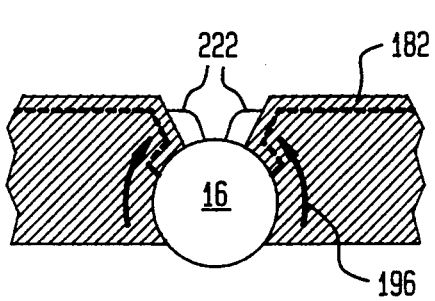

As shown in FIG. 20, the start of the embedding process causes pressurization and a downward flow of the thermoplastic material of the substrate as indicated by arrows 194. At the same time, the hole 192 provides centering forces for the conductive ball 16, as indicated by arrows 202. In a manner similar to FIG. 17, an upward flow 196 of substrate material will be caused as downward flow 198 is completed and pressure increases below the conductive ball 16, as shown in FIG. 21. As the conductive ball 16 reaches its final location, the upward flow 196 of thermoplastic substrate material forms a recess and may assist in shaping a metallization layer 182, as shown in FIG. 22. The shaping of the recess and/or metallization layer may be done by pressure acting against a driver 18, upstanding or shaped region (e.g. 114) of a presser plate 22 or similar molding structures.

In the embodiments of the invention described above, the aspect ratio of the via connection formed is essentially limited to a value of one, due to the spherical shape of conductive ball 16. since the diameter of the conductive ball is constrained in those embodiments to approximately the thickness of the substrate, the aspect ratio of the via connection may limit the minimum feature size which may be achieved in each lamina of a multi-layer device. This potential limitation may be avoided by the variation of the invention shown in FIGS. 23 and 24.

Figure 23:
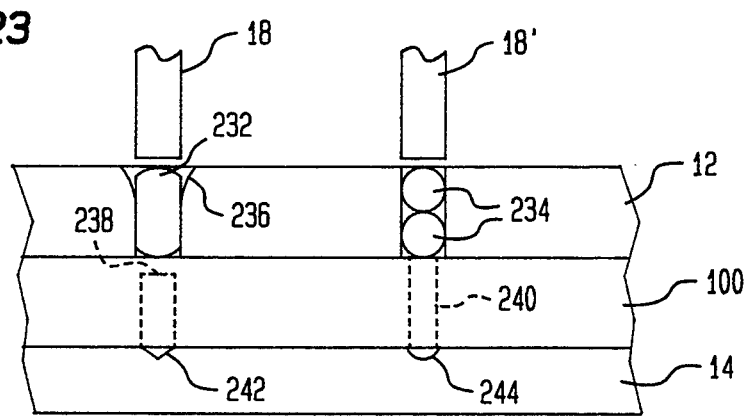

FIG. 23 essentially differs from the embodiments of the invention previously discussed by the provision of rods or pins 232 or plural conductive balls 234 which may be essentially arbitrary in number. While the rods or pins 232 are shown in FIG. 23 as solid, the pins, if desired, may be hollow (not illustrated). Additionally, the rods or pins 232, whether solid or hollow, may have an insulative coating applied to the lateral surfaces thereof. Alternatively or additionally, portions of the rods or pins 232 may have a conductive coating or plating applied thereto, as discussed above in connection with FIG. 7. Otherwise, all features of the invention described above are applicable to this embodiment of the invention. It should be noted, however, that the use of partial depth holes 238 or through-holes 240 are preferred to merely embedding plural conductive balls 234 in the substrate 100 in order to obtain some centering action to maintain the plural conductive balls in alignment, particularly if more than two balls are to be used. It should also be noted that while conical 242 and spherical 244 dimples are illustrated in die 14, a renewable surface (not illustrated in FIGS. 23 and 24, in the interest of clarity) such as 84 of FIGS. 8, 9, 11 and 12 could also be used in the same manner and with the same effect as that described above.

Figure 24:
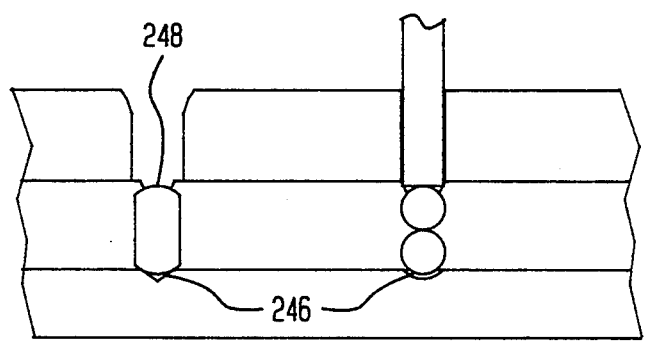

Specifically, in accordance with variations of the invention collectively illustrated in FIGS. 23 and 24, either pins 232 or plural conductive balls 234 are embedded in the substrate. Since the aspect ratio of the pins and the number of conductive balls can be varied at will, within reasonable limits (e.g. about 3:1 to 5:1), corresponding aspect ratios may be obtained thereby effectively removing all practical limitations on feature size in metallization patterns on the individual substrates. The sum of the diameters of the plural conductive balls 234 (which need not be the same) and the length of pins 232 should be substantially equal to the thickness of substrate 100 to obtain the generally matching dimensions of protrusions 246 and recesses 248 when the pins or balls have been driven to their final locations to form a via connection, as shown in FIG. 24. As with the embodiments of the invention described above, a conductive filler or solder preform may be used to fill any gap which might exist or simply to improve conductivity between lamina or to provide increased structural strength. By the same token, the number of elements to be embedded is essentially arbitrary and balls of differing sizes or highly irregular shapes could be used, with or without a solder filler.

It should be noted in regard to these variations on the basic invention that the use of a retainer plate 12 is generally considered to be preferable since use of such a plate would allow a predetermined number of conductive balls (or a substantially constant, predetermined aggregate length of irregular elements or differently sized balls) to be embedded in the substrate in a single step. With regard to pins 232, a retainer plate 12 will help to avoid bending of pins at high aspect ratios. No modification of design criteria stated above for the retainer plate 12 is required for embedding balls. However, it is considered to be desirable that the retainer plate 12 be of the same or only slightly smaller thickness than the substrate to inherently hold only the correct number (or aggregate length) of balls or other elements. Alternatively, a slight dimensional interference such as has been described above, could be provided at an appropriate depth within each hole of the retainer plate 12 to limit the number of balls which can be held. The thickness of the retainer plate 12 might also be varied to accept different numbers of conductive balls or other elements. With regard to pins, it is additionally desirable to provide a tapered portion 236 at the upper side of the retainer plate 12 to assist in the loading of pins. Both tapered and untapered holes could be provided in the retainer plate 12 which would serve to differentially accept pins and balls and which could then be simultaneously embedded in substrate 100. Additionally, the length of drivers 18 may be varied to alter the final location of either pins or conductive balls or to accommodate differing numbers of conductive balls at different locations (e.g. as will be discussed with reference to FIG. 25), as may be desired.

Figure 25:
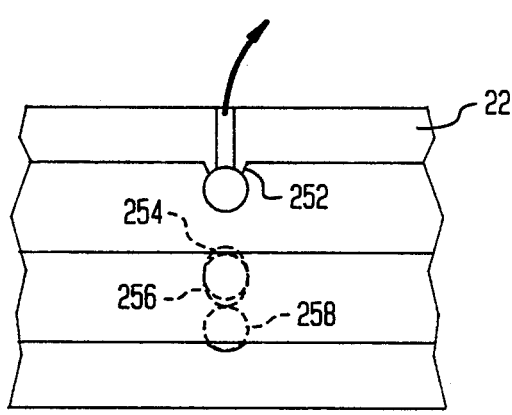
FIG. 25 illustrates a variation of the via connection of high aspect ratio and pad structures in accordance with the apparatus illustrated in FIGS. 4, 5, 11 and 12.

The use of a presser plate 22 may also be preferred in some applications as will now be discussed with reference to FIG. 25. Specifically, a single plate may be used to position balls pneumatically as described above. The same could be done with pins but a positioning plate similar to retainer plate 12 or some other mechanism would be required to achieve correct orientation of the pins. Also no lateral support to prevent bending of pins would be provided. The presser plate 22 also limits the embedding of conductive balls to a separate operation for each ball. However, in the formation of pads, rather than high aspect ratio via connections, only one conductive ball may be required. For example, if a pad (or possibly a spacer structure) were desired on the front surface of a substrate, a single ball could be embedded to position 254 either by driving presser plate 22 less than fully against the substrate or by alteration of the height of raised portion 252 thereon. The same effect could be achieved with different length drivers 18, as mentioned above, in connection with variation of the number of conductive balls which could be held by a particular hole of retainer plate 12 to result in a structure such as that indicated at 278 of FIG. 27. Otherwise, other types of pad or connection structures could be provided by driving a single ball to position 256 to result in a structure similar to 272 of FIG. 27. A via connection could be formed by driving a first conductive ball to position 256 and another conductive ball to the same location, moving the first to position 258. This operation could be repeated if additional numbers of conductive balls are required for a given aspect ratio of the via connection.

Figure 26:
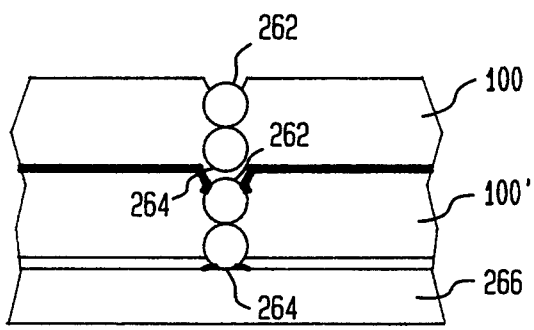
FIG. 26 illustrates an exemplary multilayer structure having a high aspect ratio via connection structure formed in accordance with the methods depicted in FIGS. 23–25.

As shown in FIG. 26, the choice of ball diameter or pin length and the depth to which balls or pins are driven retains the self-aligning feature of other embodiments of the invention by the formation of mating recesses 262 and protrusions 264. Protrusions 264 may also be used as connection pads to a chip or other structure 266. It should be noted that either or both of substrate layers 100 and 100' could have the via connections formed by pins 232 rather than the conductive balls, as illustrated in FIG. 26.

Figure 27:
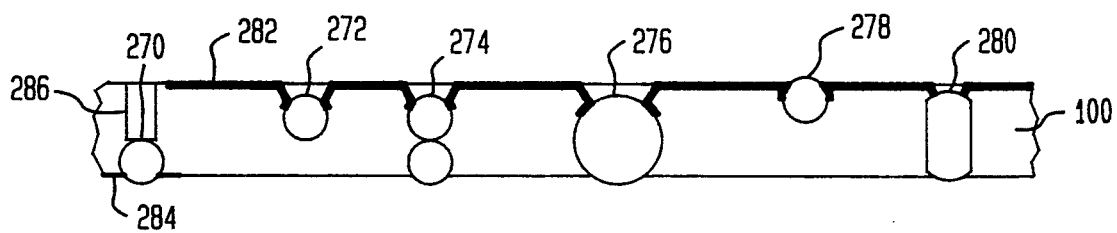
FIG. 27 shows the variety of via connection and pad structures which may be formed in a single lamina in accordance with the invention as illustrated in FIGS. 1–25.

FIG. 27 is illustrative of the variety of exemplary structures which may be formed in accordance with the invention. These include lower surface protrusion 270, recess 272 (which may be used as an alignment structure or a connection pad for a structure such as a connection pin), high aspect ratio via connection 274, low aspect ratio via connection 276 (e.g. for high current), raised pad 278 or pin via connection 280. The back surface protrusions formed by structures 270, 274, 276 and 280 are all appropriate for connection to other structure such as a chip, as shown in FIGS. 7 and 14. Cooperating metallization layers can be provided wherever desired as shown at 282 and 284. It is important to note that the connection of 284 to 270 is not as sound as that from 282 to 278. It is also considered to be within the scope of the present invention to perform the embedding process from both sides of the substrate 100 either simultaneously or sequentially whereby the structure of the pad and connection 282, 278 could be duplicated at location 270 to achieve a more secure electrical connection to 284 and avoiding formation of hole 286. Via connections could also be formed from both sides of the substrate, but this is considered to be less reliable and, hence, less desirable than other alternatives which those skilled in the art will be able to fabricate in light of the teachings of the present specification. It is especially important to note that the variety of structures illustrated in FIG. 27 could all be formed simultaneously in a single substrate processing step by loading first the large diameter balls, then rods and then small diameter balls in a retainer plate for the front surface embedding process. A pneumatic presser plate 22 is, in this case, considered preferable for the back surface embedding process. Differential loading of conductive balls of different diameter can be achieved by mechanical shaping of the upstanding portions 28 of presser plate 22 (FIG. 4, 11 or 25) or by other techniques such as providing separate pneumatic manifolds for each diameter to be used.

In view of the foregoing, it will be clear to those skilled in the art that the above described invention provide for the production of pads and vias or improved electrical characteristics in a minimum number of steps and which will provide a structure which is also self-aligning from lamina to lamina in a multi-layer device. The via and pad structure also provides a connection to patterned conductive layers which is both mechanically and electrically improved in comparison with the prior art and MLC structures in particular. The invention imposes no practical limitation on feature size of interconnection patterns since aspect ratio of vias may be controlled at will. Positional accuracy is high and repeatable and can be further enhanced by the provision of partial depth holes or through holes in the substrate. Accordingly, the above meritorious effects of the invention allow a high quality, complex electronic product to be fabricated at high manufacturing throughput.

While the invention has been described in terms of a single basic embodiment with variations thereon which may be preferred for certain enumerated applications, those skilled in the art will recognize that the invention can be practiced with modification within the spirit and scope of the appended claims.

Having thus described my invention, what we claim as new and desire to secure by Letters Patent is as follows:

1. A substrate layer for an electronic module consisting essentially of a relatively non-conductive polymer material having a relatively conductive region therein formed by a process comprising the steps of
    embedding at least one conductive element in said relatively non-conductive polymer material of said substrate, said at least one conductive element having a maximum dimension which is approximately the same as or a fraction of a thickness of said polymer material, and
    causing reflow of at least a portion of said relatively non-conductive polymer material of said substrate around end portions of said conductive element during said embedding step.

2. A substrate formed by the process recited in claim 1, wherein said process includes the further step of
    positioning said at least one conductive element adjacent a surface of said relatively non-conductive polymer material, and
    applying pressure to said relatively non-conductive polymer material at least partly through said conductive element.

3. A substrate formed by the process according to claim 2, wherein said positioning step includes
    placing said at least one conductive element in an aperture of a retainer plate.

4. A substrate formed by the process according to claim 2, wherein said positioning step includes
placing said at least one conductive element in a predetermined location on a means for pressing said conductive element into said relatively non-conductive polymer material.

5. A substrate formed by the process as recited in claim 4, wherein said conductive element is retained in said predetermined location on said pressing means by suction.

6. A substrate formed by the process as recited in claim 4, wherein said predetermined location on said presser means includes a raised portion for holding said conductive element and said presser means embeds said conductive element a predetermined distance beyond the surface through which said conductive element is pressed.

7. A substrate formed by the process as recited in claim 6, wherein said raised portion includes a shaped portion and wherein said shaped portion limits said reflow of said relatively non-conductive polymer material.

8. A substrate formed by the process recited in claim 7, wherein said shaped portion of said raised portion of said presser means is generally frustro-conical.

9. A substrate formed by the process as recited in claim 6, wherein said conductive element is retained in said predetermined location on said pressing means by suction.

10. A substrate formed by the process as recited in claim 7, wherein said conductive element is retained in said predetermined location on said pressing means by suction.

11. A substrate formed by the process as recited in claim 8, wherein said conductive element is retained in said predetermined location on said pressing means by suction.

12. A substrate formed by the process as recited in claim 3, wherein said at least one conductive element is pressed into said relatively non-conductive polymer material from said aperture by a driver means.

13. A substrate formed by the process as recited in claim 12, including the further step of limiting said reflow in accordance with a portion of the surface of said driver means.

14. A substrate formed by the process as recited in claim 13, wherein a portion of a surface of said driver means substantially conforms to an surface portion of said at least one conductive means.

15. A substrate formed by the process as recited in claim 1, wherein said relatively non-conductive polymer is formed as a solid sheet.

16. A substrate formed by the process as recited in claim 1, wherein said relatively non-conductive polymer is formed as a solid sheet having at least one through hole formed therein at a location at which said conductive element is to be embedded.

17. A substrate formed by the process as recited in claim 1, wherein said relatively non-conductive polymer is formed as a solid sheet having a thickness and having at least one hole formed therein to a depth which is less than said thickness at a location at which said conductive element is to be embedded.

18. A substrate formed by the process as recited in claim 1, wherein said relatively non-conductive polymer is formed as a solid sheet of thermoplastic material.

19. A substrate formed by the process as recited in claim 1, wherein said relatively non-conductive polymer is formed as a solid sheet of thermoplastic material having at least one through hole formed therein at a location at which said conductive element is to be embedded.

20. A substrate formed by the process as recited in claim 1, wherein said relatively non-conductive polymer is formed as a solid sheet of thermoplastic material having a thickness and having at least one hole formed therein to a depth which is less than said thickness at a location at which said conductive element is to be embedded.

21. A substrate formed by the process as recited in claim 1, wherein said relatively non-conductive polymer is formed as a solid sheet of liquid crystal polymer.

22. A substrate formed by the process as recited in claim 1, wherein said relatively non-conductive polymer is formed as a solid sheet of liquid crystal polymer having at least one through hole formed therein at a location at which said conductive element is to be embedded.

23. A substrate formed by the process as recited in claim 1, wherein said relatively non-conductive polymer is formed as a solid sheet of liquid crystal polymer having a thickness and having at least one hole formed therein to a depth which is less than said thickness at a location at which said conductive element is to be embedded.

24. A substrate formed by the process as recited in claim 1, further including the step of forming a conductive layer on a surface portion of said conductive element.

25. A substrate formed by the process as recited in claim 1, wherein said conductive element is in the form of a conductive ball.

26. A substrate formed by the process as recited in claim 25, further including the step of forming a conductive layer on a surface portion of said conductive element.

27. A substrate formed by the process as recited in claim 26, wherein said conductive layer includes a reflowable conductive material.

28. A substrate formed by the process as recited in claim 1, wherein said conductive element is in the form of a generally cylindrical pin.

29. A substrate formed by the process as recited in claim 28, further including the step of forming a conductive layer on a surface portion of said conductive element.

30. A substrate formed by the process as recited in claim 29, wherein said conductive layer includes a reflowable conductive material.

31. A substrate formed by the process as recited in claim 24, wherein said relatively non-conductive polymer material is formed as a solid sheet having a thickness and including the further step of forming a hole through at least a portion of said thickness at a location where said conductive element is to be embedded.

32. A substrate formed by the process as recited in claim 1, including the step of forming a conductive layer on a portion of a surface of said relatively non-conductive polymer material.

33. A relatively non-conducting polymer substrate having at least one conducting element embedded therein and retained in said substrate by said relatively non-conducting polymer material of said substrate which is reflowed around end portions of said conducting element when said at least one conducting element is embedded in said substrate, said at least one conducting element having a maximum dimension approximately equal to or a fraction of a thickness of said polymer substrate.

34. A substrate as recited in claim 33, wherein said at least one conducting element is in the form of a pin.

35. A substrate as recited in claim 33, wherein said at least one conducting element is in the form of a ball.

36. A substrate as recited in claim 35, wherein said relatively non-conducting polymer material is in the form of a solid sheet.

37. A substrate as recited in claim 36, further including a conductive layer on at least a portion of said solid sheet.

38. A substrate as recited in claim 33, wherein said at least one conductive element includes a layer of conductive material on a surface portion thereof.

39. A substrate as recited in claim 38, wherein said conductive material includes a reflowable conductive material.

40. A substrate as recited in claim 38, wherein said relatively non-conductive material is in the form of a solid sheet and includes means for limiting damage to said layer of conductive material on said at least one conductive element when said at least one conductive element is embedded in said solid sheet.

41. A substrate as recited in claim 40, wherein a portion of said solid sheet has a predetermined thickness and said means for limiting damage to said layer of conductive material comprises a hole through at least a portion of said predetermined thickness at a location where said conductive element is to be embedded.

42. A substrate as recited in claim 37, wherein said at least one conductive element includes a layer of conductive material on a surface portion thereof.

43. A substrate as recited in claim 42, wherein said relatively non-conductive material includes means for limiting damage to said layer of conductive material on said at least one conductive element when said at least one conductive element is embedded in said solid sheet.

44. A substrate as recited in claim 43, wherein said means for limiting damage to said layer of conductive material comprises a hole through at least a portion of said predetermined thickness at a location where said conductive element is to be embedded.

45. A substrate as recited in claim 33, wherein said conductive means forms a protrusion from a surface of said relatively non-conductive polymer material.

46. A substrate as recited in claim 33, wherein said conductive element forms a recess in a surface of said relatively non-conductive polymer material.

47. A substrate as recited in claim 45, wherein said conductive element forms a recess in a surface of said relatively non-conductive polymer material.

48. A substrate as recited in claim 47, wherein said recess is located to receive a protrusion formed on another substrate when correctly registered therewith in a multi-layer assembly.

49. A substrate as recited in claim 47, wherein said protrusion is located to enter a recess formed on another substrate when correctly registered therewith in a multi-layer assembly.

50. A substrate as recited in claim 48, wherein said recess is generally frustro-conically shaped.

51. A substrate as recited in claim 37, wherein said reflowed material of said substrate retains a portion of said conductive layer against said conductive element.

52. A substrate as recited in claim 33, including a plurality of conductive elements embedded at a common location with reference to a surface of said relatively non-conductive polymer material and further including a conductive fill material between at least some of said plurality of conductive elements.

53. A substrate as recited in claim 47, further including conductive fill material in said recess.

54. Apparatus for forming a relatively non-conductive polymer substrate for an electronic module having conductive regions therein including means for supporting a volume of relatively non-conducting polymer material in the form of a layer, and means for positioning at least one conductive element having a maximum dimension approximately equal to or a fraction of a thickness of said layer adjacent a surface of a volume of relatively non-conductive polymer material, and introducing said at least one conductive element into said relatively non-conductive polymer material while causing reflowing of a portion of said relatively non-conductive polymer material by said means for supporting a volume of relatively non-conductive polymer of said layer around end portions of said at least one conductive element.

55. Apparatus as recited in claim 54, wherein said means for supporting said volume of relatively non-conductive polymer material includes a surface having at least one dimple formed therein.

56. Apparatus as recited in claim 55, wherein said dimple is generally conical in shape.

57. Apparatus as recited in claim 54, wherein said means for supporting said volume of relatively non-conductive polymer material includes a renewable surface.

58. Apparatus as recited in claim 57, wherein said renewable surface is resilient.

59. Apparatus as recited in claim 57, wherein said renewable surface is porous.

60. Apparatus as recited in claim 57, wherein said renewable surface is abrasive.

61. Apparatus as recited in claim 54, wherein said means for positioning said at least one conductive element and introducing said at least one conductive element into said relatively non-conductive polymer material includes an apertured plate for positioning said at least one conductive element and a driver means for pressing said at least one conductive element from said apertured plate into said relatively non-conductive polymer material.

62. Apparatus as recited in claim 54, wherein said means for positioning said at least one conductive element and introducing said at least one conductive element into said relatively non-conductive polymer material includes a raised portion for positioning said at least one conductive element.

63. Apparatus as recited in claim 62, wherein said raised portion is frustro-conically shaped.

64. Apparatus as recited in claim 54, wherein said means for positioning said at least one conductive element and introducing said at least one conductive element into said relatively non-conductive polymer material includes a means for retaining said at least one conductive element in a predetermined position by means of a partial vacuum.

65. A method of forming a relatively non-conductive polymer substrate of a relatively non-conductive polymer material, said substrate having conductive regions therein including the steps of supporting a volume of relatively non-conducting polymer material in the form of a layer, positioning at least one conductive element adjacent a surface of a volume of relatively non-conductive polymer material, said at least one conductive element having a maximum dimension which is approximately equal to or a fraction of a thickness of said layer, and introducing said at least one conductive element into said relatively non-conductive polymer material while causing reflowing of a portion of said relatively non-conductive polymer material of said layer at end portions of said conductive element.

66. A method as recited in claim 65, including the further step of heating said substrate to a temperature below that at which said relatively non-conductive polymer material will spontaneously flow.

67. A method as recited in claim 65, wherein said introducing step is carried out to a predetermined depth relative to a surface of said layer.

68. A method as recited in claim 65, including the further step of depositing a metallized layer on at least a portion of a surface of said layer of said relatively non-conductive polymer material.

69. A method as recited in claim 68, wherein said introducing step is carried out to a predetermined depth relative to said surface of said layer of relatively non-conductive polymer material.

70. A method as recited in claim 68, wherein said reflowing of said relatively non-conductive polymer material deforms a portion of said metallized layer against said at least one conductive element.

71. A method as recited in claim 65, including the further step of forming an aperture through at least a portion of said layer of said relatively non-conductive polymer material.

72. A method as recited in claim 68, including the further step of forming an aperture through at least a portion of said layer of said relatively non-conductive polymer material.

73. A method as recited in claim 65, including the further step of forming a conductive coating or said at least one conductive element.

74. A method as recited in claim 73, including the further step of forming an aperture through at least a portion of said layer of said relatively non-conductive polymer material.

75. A method as recited in claim 68, including the further step of forming a conductive coating said at least one conductive element.

76. A method as recited in claim 75, including the further step of forming an aperture through at least a portion of said layer of said relatively non-conductive polymer material.

77. A method as recited in claim 65, including the further step of positioning a plurality of said conductive elements in a aperture of an apertured plate.

78. A method as recited in claim 67, wherein said introducing step is carried out to a depth below said surface to form a recess in said surface.

79. A method as recited in claim 67, wherein said introducing step is carried out to a depth relative to said surface to form a protrusion from said surface.

80. A method as recited in claim 67, wherein said introducing step is carried out to a depth below said surface to form a protrusion from another surface of said layer.

81. A method as recited in claim 65, including the further step of depositing a conductive coating on a surface portion of said conductive element which is exposed by said relatively non-conductive polymer material.

82. A method as recited in claim 65, wherein said supporting step includes supporting said volume of relatively non-conductive polymer material on a surface of a resilient material.

83. A method as recited in claim 65, wherein said supporting step includes supporting said volume of relatively non-conductive polymer material on a surface of a porous material.

84. A method as recited in claim 65, wherein said supporting step includes supporting said volume of relatively non-conductive polymer material on a surface of an abrasive material.

85. A method as recited in claim 65 wherein said introducing step includes guiding said conductive element within said volume of said relatively non-conducting polymer material.

86. A method as recited in claim 65, wherein said introducing step includes causing a wiping of a portion of a surface of said conductive element with said relatively non-conductive polymer material.

87. A method as recited in claim 68, wherein said introducing step includes causing a wiping of a portion of a surface of said conductive element with said metallized layer.

88. A method as recited in claim 65, including the further step of assembling said relatively non-conductive polymer substrate with another substrate.

89. A method as recited in claim 65, including the further step of assembling said relatively non-conductive polymer substrate with another relatively non-conductive polymer substrate.

90. A method as recited in claim 67, wherein said introducing step is carried out to a depth relative to said surface to form a recess on one side of said substrate and a protrusion from an opposite surface of said substrate.

91. A method as recited in claim 90, including the further step of assembling said relatively non-conductive polymer substrate with another relatively non-conductive polymer substrate and wherein said protrusion of one said substrate and said another substrate is received by a recess of the other of said substrate and said another substrate.

92. A method as recited in claim 90, including the further step of locating another substrate on said relatively non-conductive polymer substrate by means of at least one of said protrusion and said recess.

93. A method comprising the steps of embedding a conductive element into a relatively non-conductive polymer material at a site thereon having a predetermined area extending around said conductive element, and substantially eliminating a dimensional change of said predetermined area of said site during and subsequent to said embedding step by application of heating to said polymer material, prior to said embedding step, to heat said polymer material to a temperature slightly below a temperature at which said polymer material will spontaneously flow.

94. A method as recited in claim 93, wherein said step of eliminating dimensional change is accomplished by using a thermoplastic material within said predetermined area of said site.

95. A method as recited in claim 93, wherein said step of eliminating dimensional change is accomplished by using a liquid crystal polymer material within said predetermined area of said site.

* * * * *